US006924562B2

(12) United States Patent
Kinoshita (10) Patent No.: US 6,924,562 B2
(45) Date of Patent: Aug. 2, 2005

(54) SEMICONDUCTOR INTEGRATED CIRCUIT HAVING AT LEAST ONE OF A POWER SUPPLY PLANE AND GROUND PLANE DIVIDED INTO PARTS INSULATED FROM ONE ANOTHER

(75) Inventor: Yasushi Kinoshita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/446,056

(22) Filed: May 28, 2003

(65) Prior Publication Data

US 2003/0222356 A1 Dec. 4, 2003

(30) Foreign Application Priority Data

May 31, 2002 (JP) ........................................ 2002-159916

(51) Int. Cl.[7] .............................................. H01L 23/02
(52) U.S. Cl. ...................... 257/924; 257/698; 257/781; 257/786
(58) Field of Search ................................. 257/698, 781, 257/786, 924

(56) References Cited

U.S. PATENT DOCUMENTS

| | | | | |
|---|---|---|---|---|
| 5,973,928 A | * | 10/1999 | Blasi et al. .................. | 361/760 |
| 6,335,566 B1 | * | 1/2002 | Hirashima et al. ........... | 257/686 |
| 6,643,916 B2 | * | 11/2003 | Larson ........................ | 29/610.1 |
| 2002/0088977 A1 | * | 7/2002 | Mori et al. .................... | 257/68 |
| 2003/0011960 A1 | * | 1/2003 | Koning et al. ............... | 361/311 |
| 2003/0076197 A1 | * | 4/2003 | Novak et al. ................ | 333/136 |

FOREIGN PATENT DOCUMENTS

| | | |
|---|---|---|
| JP | 2000-307005 A | 11/2000 |
| JP | 2001-44591 A | 2/2001 |
| JP | 2001-284483 A | 10/2001 |

* cited by examiner

*Primary Examiner*—Tom Thomas
*Assistant Examiner*—Matthew E. Warren
(74) *Attorney, Agent, or Firm*—Sughrue Mion, PLLC (57) ABSTRACT

A semiconductor integrated circuit is provided. A semiconductor package having a printed circuit board, a semiconductor chip mounted on a first surface of said printed circuit board, at least one power supply electrode on a second surface of said printed circuit board and connected to at least one power supply terminal of said semiconductor, and at least one ground electrode on a second surface of said printed circuit board and connected to at least one ground terminal of said semiconductor chip; a decoupling capacitor outside said semiconductor package and formed by a power supply plane connected to said power supply electrodes, and a ground plane connected to said ground electrodes; at least one power supply electrode pad connected to said power supply plane; and at least one ground electrode pad connected to said ground plane.

16 Claims, 6 Drawing Sheets

SEMICONDUCTOR INTEGRATED CIRCUIT HAVING AT LEAST ONE OF A POWER SUPPLY PLANE AND GROUND PLANE DIVIDED INTO PARTS INSULATED FROM ONE ANOTHER

BACKGROUND OF THE INVENTION

1. Field of the Invention

The present invention relates to a semiconductor integrated circuit, and, more particularly to a semiconductor integrated circuit having electrode pads which are arranged in an array-like form on its surface. And another invention relates to a printed circuit board having the semiconductor integrated circuit mounted thereon, and an electronic apparatus including the printed circuit board.

2. Description of the Related Art

In a semiconductor integrated circuit, a printed circuit board is loaded with a semiconductor chip such as an LSI (Large Scale Integrated Circuit), the semiconductor chip and the printed circuit board are packed in the form of a semiconductor package. Power supply electrode pads and ground electrode pads are provided on the bottom surface of the semiconductor package. The power supply electrode pads provide power supply potential supplied to the semiconductor chip, and ground electrode pads connect the semiconductor chip to the ground potential (ground) on the external circuit side.

In recent years, the circuit scale of semiconductor integrated circuits is enlarging. Along with the enlargement of the circuit scale of the semiconductor integrated circuits, the number of pins necessary for the connection between a semiconductor integrated circuit and an external circuit is increasing. For this reason, there have been developed the semiconductor integrated circuits each having a bottom surface on which a plurality of electrode pads are arranged in an array-like form. The electrode pads are power supply electrode pads connected to a power supply, ground electrode pads connected to the ground and signal electrode pads through which signals are inputted/outputted.

Heretofore, an arrangement of the power supply electrode pads and the ground electrode pads in the semiconductor integrated circuit has been determined by taking into consideration easiness of the circuit design of the semiconductor integrated circuit, an allowable current value of an output buffer for an output signal, and the like. The relative positional relationship between the power supply electrode pads and the ground electrode pads has not particularly been taken into account.

On the other hand, there is known the technique in which a decoupling capacitor is provided on a printed circuit board. It is provided in order to reduce the current noise which is propagated through power supply wiring or ground wiring to be inputted to a semiconductor chip and the radiation noise of the electromagnetic waves which are radiated along with the operation of a semiconductor integrated circuit. In the technique, it is important the position of the decoupling capacitor on the printed circuit board in the reduction of the noise. It seems to be good to be arranged near the place where more noise is occurred.

However, in the above-mentioned electrode pads, the position of the decoupling capacitor becomes far from the power supply electrode pads and the ground electrode pads of the semiconductor integrated circuit, or interferes with other wiring patterns depending on the wiring pattern of the printed circuit board. The position of the power supply electrode pads and the ground electrode pads related to the portion of the decoupling capacitor are determined only on the basis of the convenience of the semiconductor integrated circuit. As a result, there is encountered a problem in that the geometrical arrangement of individual power supply electrode pads and the ground electrode pads can not be made to accommodate a connection to the decoupling capacitor. Thus, the semiconductor integrated circuits in which the higher speed of the operating frequency is remarkably progressing, such as CPUs (Central Processing Units) and microprocessors, have a problem in that there is increased radiation noise due to the electromagnetic waves radiated from a printed circuit board and an electronic apparatus loaded with the printed circuit board. As a result, it becomes impossible to meet the standards for the unnecessary radiation noise which are regulated in various countries.

In order to solve the above-mentioned problem, there is disclosed the technique about a semiconductor integrated circuit in a published application (JP 2000-307005 A). In the semiconductor integrated circuit, a plurality of ground electrode pads and a plurality of power supply electrode in the semiconductor package are concentratedly arranged at the central portion of the bottom surface of the semiconductor package so as to be opposed to each other, and these electrode pads are connected to a decoupling capacitor through through-opening portions. According to this structure, it is possible to reduce the radiation noise of the electromagnetic waves radiated from the semiconductor integrated circuit.

In addition, in another published application (JP 2001-44591 A, JP 2001-284483 A), there is disclosed the technique in which a decoupling capacitor is provided within a printed circuit board inside a semiconductor package. Power supply vias and ground vias are arranged in lattice so as to be adjacent to each other and the decoupling capacitor is connected to power supply terminals of a semiconductor chip through the power supply vias and the decoupling capacitor is connected to ground terminals through the ground vias. Thus, the magnetic field generated by the current flow through the power supply vias and the magnetic field generated by the current flow through the ground vias cancel each other to reduce the inductance between the semiconductor chip and the decoupling capacitor, so that the decoupling capacitor effectively absorb the noise.

However, the above-mentioned prior arts have a following problem. In the technique disclosed in JP 2000-307005 A, the decoupling capacitor is directly formed on the rear surface of the printed circuit board having the semiconductor chip mounted on its surface. Accordingly, the decoupling capacitor is affected by parasitic capacitance with mounting on the printed circuit board, and it will be decrease the function of the decoupling capacitor. In addition, in the techniques disclosed in JP 2001-44591 A and JP 2001-284483 A, the decoupling capacitor is self-contained in the printed circuit board within the semiconductor package. For this reason, in those conventional techniques, there is encountered a problem in that after completion of the packaging of the semiconductor package, it is impossible to change the characteristics of the decoupling capacitor. Consequently, these semiconductor integrated circuits are limited in application of use thereof and hence are poor in wide application.

BRIEF SUMMARY OF THE INVENTION

The inventors have found that in order for the decoupling capacitor to reduce the noise, it is important not only to position the decoupling capacitor correctly but also to the decoupling capacitor to have certain characteristics. The present invention resolves these problems.

Then, the object of the present invention is to provide in a semiconductor integrated circuit having at least a semiconductor package and decoupling capacitor, it is possible to change the characteristics of the decoupling capacitor after completion of the manufacturing of the semiconductor package, and to reduce the noise.

According to an aspect of the present invention, a semiconductor integrated circuit comprises: a semiconductor package having a printed circuit board, a semiconductor chip mounted on a first surface of the printed circuit board, at least one power supply electrode on a second surface of the printed circuit board and connected to at least one power supply terminal of the semiconductor chip, and at least one ground electrode on the second surface of the printed circuit board and connected to at least one ground terminal of the semiconductor chip; a decoupling capacitor outside the semiconductor package and formed by a power supply plane connected to the power supply electrodes, and a ground plane connected to the ground electrodes; at least one power supply electrode pad connected to the power supply plane; and at least one ground electrode pad connected to the ground plane.

The decoupling capacitor in the present invention is provided outside the semiconductor package, then it is possible to adjust the characteristics of the decoupling capacitor after completion of the manufacturing of the semiconductor package. According to this present invention, for example, it is possible to set the capacitance of the decoupling capacitor selectively by taking into the application of use, the characteristic of the semiconductor package, the printed circuit board, and so on. Then, as the result, it also will be able to reduce the noise of the semiconductor integrated circuit.

DETAILED DESCRIPTION OF THE INVENTION

Figure 1:
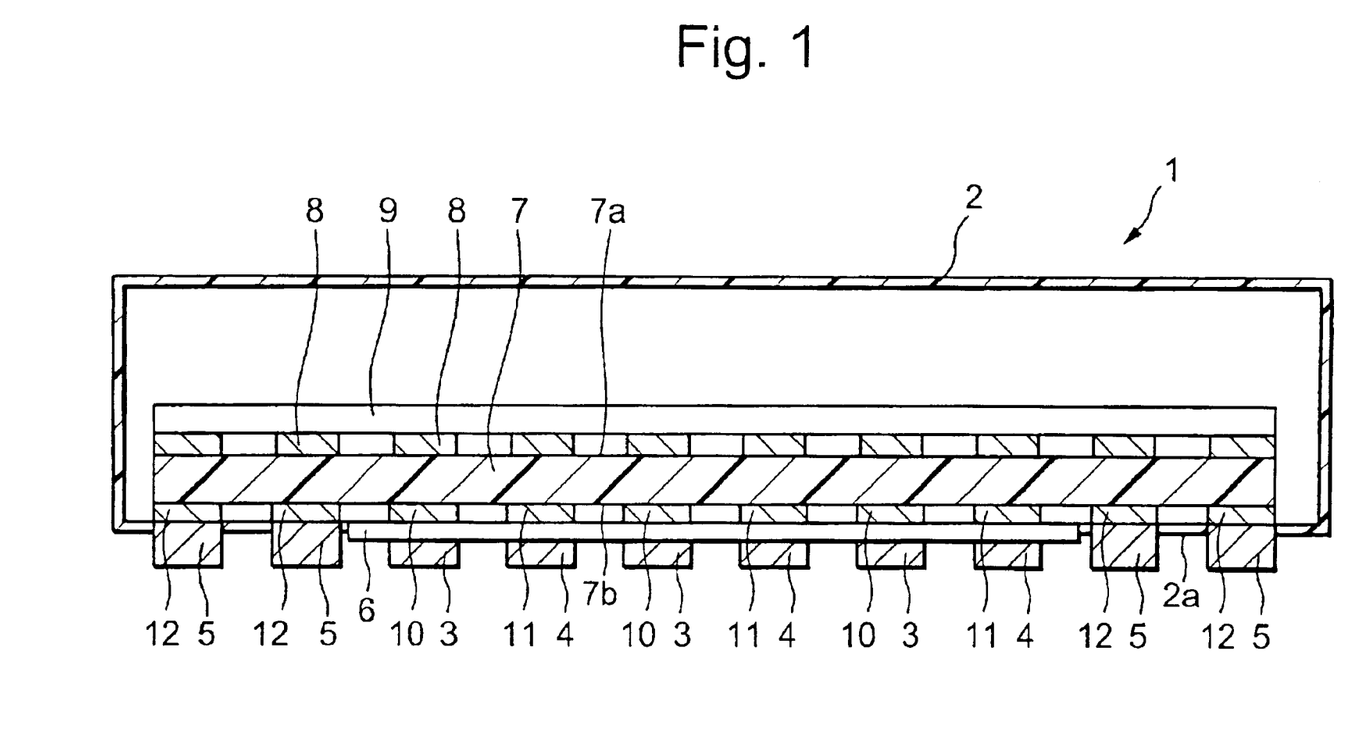
FIG. 1 is a cross sectional view showing a semiconductor integrated circuit according to a first embodiment of the present invention.
Figure 2:
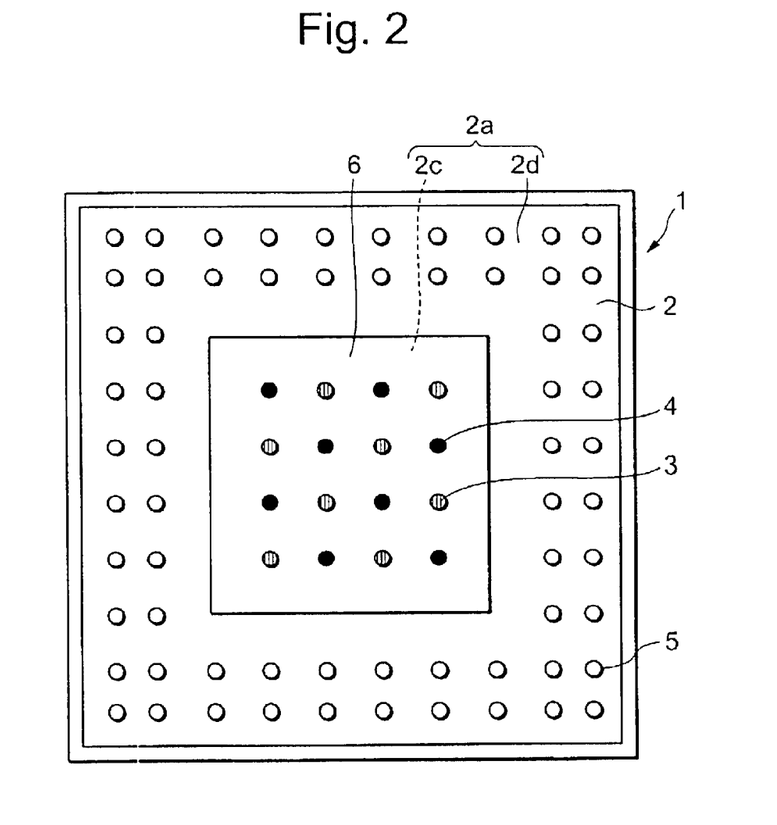
FIG. 2 is a plan view showing the semiconductor integrated circuit according to the present embodiment.
Figure 3:
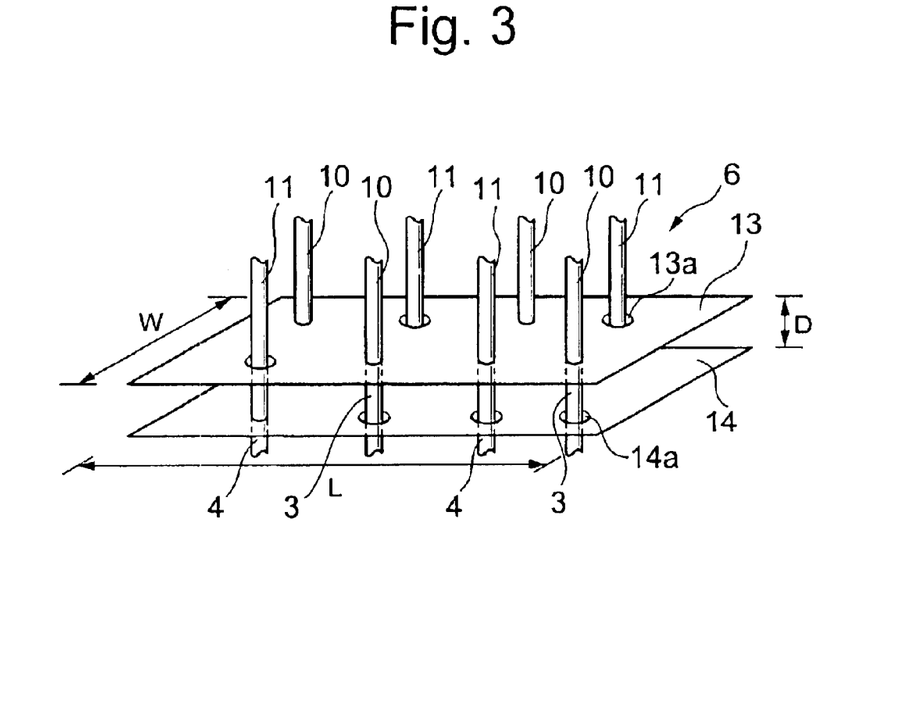
FIG. 3 is a perspective view showing a decoupling capacitor provided in the semiconductor integrated circuit according to the present embodiment.
Figure 4:
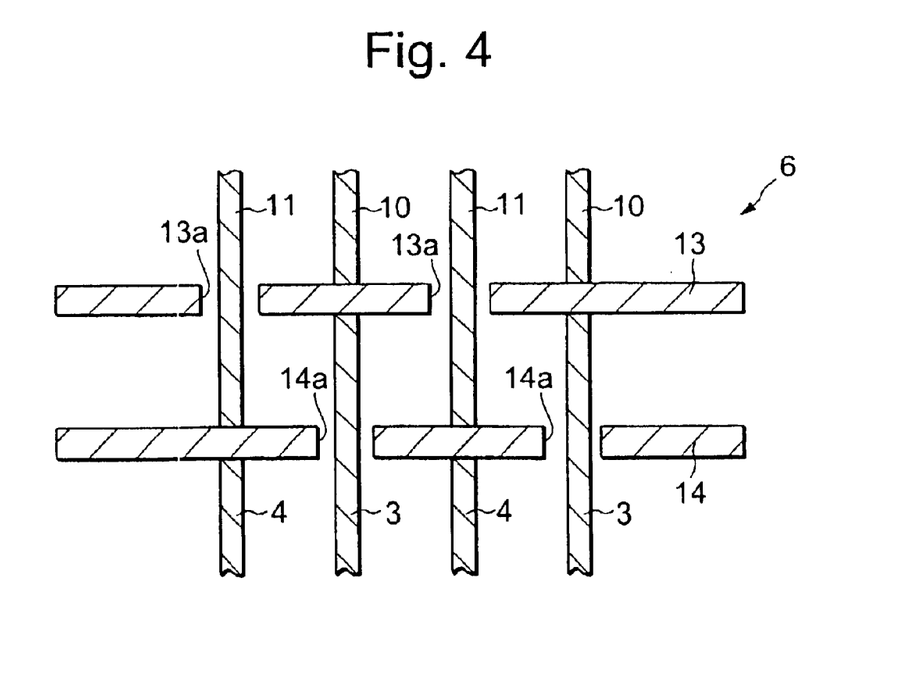
FIG. 4 is a cross sectional view showing the decoupling capacitor provided in the semiconductor integrated circuit according to the present embodiment.

First of all, a first embodiment of the present invention will hereinbelow be described. FIG. 1 is a cross sectional view showing a semiconductor integrated circuit according to the present embodiment, and FIG. 2 is a plan view of the semiconductor integrated circuit according to the present embodiment. FIG. 3 is a perspective view showing a decoupling capacitor provided in the semiconductor integrated circuit according to the present embodiment, and FIG. 4 is a cross sectional view of the decoupling capacitor provided in the semiconductor integrated circuit according to the present embodiment. In addition, FIGS. 5(a) and (b) are plan views showing a power supply plane and a ground plane of the semiconductor integrated circuit according to the present embodiment, respectively.

As shown in FIG. 1, an LSI package 2 as a semiconductor package is provided in a semiconductor integrated circuit 1 according to the present embodiment. In addition, a plurality of power supply electrode pads 3, a plurality of ground electrode pads 4 and a plurality of signal electrode pads 5 are provided on a bottom surface 2a of the LSI package 2, respectively. The power supply electrode pads 3 are adapted to supply therethrough a power supply potential to the LSI package 2 connected to external power supply wiring (not shown). The ground electrode pads 4 are connected to external ground wiring to be adapted to supply therethrough the ground potential (not shown) to the LSI package 2. The signal electrode pads 5 are adapted to input/output therethrough a signal to/from an external circuit (not shown). Moreover, a decoupling capacitor 6 connected to the LSI package 2, the power supply electrode pads 3 and the ground electrode pads 4 is provided at the central portion of the bottom surface 2a of the LSI package 2.

A printed circuit board 7 is provided inside the LSI package 2 and wiring (not shown) is printed on a surface 7a of the printed circuit board 7. Then, the surface 7a of the printed circuit board 7 is loaded with an LSI core chip 9 through a plurality of solder bumps 8. The LSI core chip 9 is such that for example, an LSI and the like are formed on the surface of a silicon substrate. A plurality of power supply electrodes (not shown), a plurality of ground electrodes (not shown) and a plurality of signal electrodes (not shown) are respectively provided on the rear surface of the LSI core chip 9 to be connected to the wiring of the printed circuit board 7 through the solder bumps 8. A plurality of connection via lines 10 for power supply wiring, a plurality of connection via lines 11 for ground wiring and a plurality of connection via lines 12 for signal wiring are respectively provided on a rear surface 7b of the printed circuit board 7. The connection via lines 10 for power supply wiring are connected to the power supply electrodes of the LSI core chip 9, the connection via lines 11 for ground wiring are connected to the ground electrodes of the LSI core chip 9, and the connection via lines 12 for signal wiring are connected to the signal electrodes of the LSI core chip 9.

The connection via lines 10 for power supply wiring and the connection via lines 11 for ground wiring are arranged at the central portion of the rear surface 7b of the printed circuit board 7. For example, the connection via lines 10 for power supply wiring and the connection via lines 11 for ground wiring are arranged in matrix so as to be adjacent to each other. On the other hand, the connection via lines 12 for signal wiring are disposed in the peripheral portion of the rear surface 7b of the printed circuit board 7 so as to surround the area in which the connection via lines 10 for power supply wiring and the connection via line 11 for ground wiring are arranged.

As shown in FIG. 2, the power supply electrode pads 3 (circles having vertical stripes in its inside) and the ground electrode pads 4 (black circles (●)) are arranged at a central portion 2c of the bottom surface 2a of the LSI package 2, i.e., they are regularly disposed in matrix so as to be adjacent to one another. The central portion 2c is the area corresponding to the area in which the decoupling capacitor 6 is arranged outside the LSI package 2. In addition, the signal electrode pads 5 (white circles (○)) are arranged in a peripheral portion 2d of the bottom surface 2a of the LSI package 2. By the way, as well as FIG. 2, in FIGS. 5(a) and (b) and FIGS. 6(a) and (b) as will be described later, for the sake of convenience, the power supply electrode pads 3 are indicated by circles having vertical stripes in its inside, the ground electrode pads 4 and the connection via lines 11 for ground wiring are indicated by black circles (●), and the signal electrode pads 5 are indicated by white circles (○). In addition, in FIG. 2, FIGS. 5(a) and (b) and FIGS. 6(a) and (b), the power supply electrodes 3 and the ground electrode pads 4 are shown only in the form of 4(row)×4(column) in total. However, the power supply electrode pads 3 and the ground electrode pads 4 may be provided so as to become smaller or larger than 4(row)×4(column). This is also applied to the signal electrode pads 5.

According to such arrangement, the power supply electrodes and the ground electrodes can be connected to the decoupling capacitor. In addition, it is possible to shorten the wiring length between the power supply electrodes and the ground electrodes, and the decoupling capacitor. As a result, the decoupling capacitor can effectively absorb the noise to reduce the radiation of unnecessary electromagnetic waves from the semiconductor integrated circuit. Also, since the decoupling capacitor is provided outside the semiconductor package, it is possible to adjust the characteristics of the decoupling capacitor after completion of the manufacturing of the semiconductor package.

In addition, by arranging the power supply electrodes 3 and the ground electrodes 4 in matrix so as to be adjacent to each other, this results in that the magnetic field generated from the wiring distributed between the power supply electrodes and the power supply electrode pads of the semiconductor chip, and the magnetic field generated from the wiring distributed between the ground electrodes and the ground electrode pads of the semiconductor chip cancel each other. As a result, it is possible to reduce the inductance of these wiring lines so that the decoupling capacitor can effectively absorb the noise.

Figure 5A:
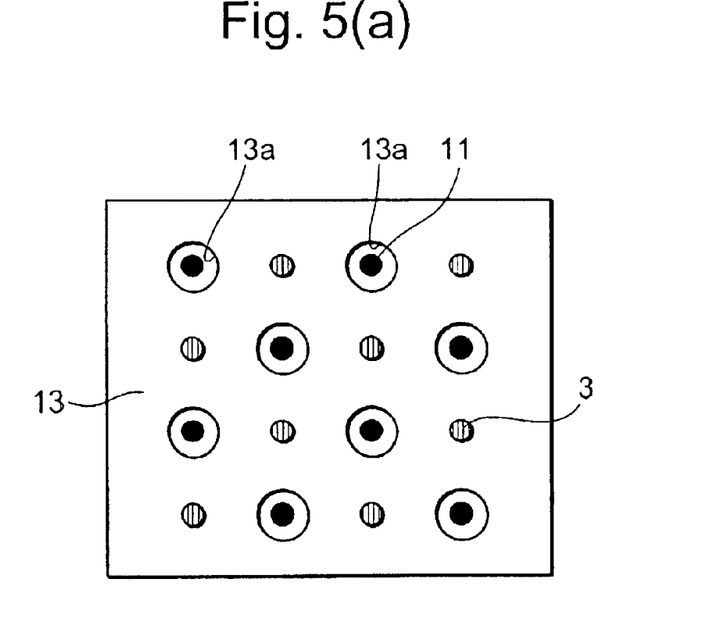
FIGS. 5(a) and (b) are plan views showing a power supply plane and a ground plane of the semiconductor integrated circuit according to the present embodiment, respectively.

As shown in FIG. 3, FIG. 4 and FIGS. 5(a) and (b), in the decoupling capacitor 6, a power supply plane 13 and a ground plane 14 are provided in parallel with the bottom surface 2a (refer to FIG. 1) of the LSI package 2. The power supply plane 13 and the ground plane 14 are rectangle-shaped plates and have nearly the same shape. In addition, the power supply plane 13 and the ground plane 14 are insulated from each other. Moreover, a plurality of opening portions 13a are formed through the power supply plane 13, and a plurality of opening portions 14a are formed through the ground plane 14.

In addition, the connection via lines 10 for power supply wiring are connected to the upper surface of the power supply plane 13, the power supply electrode pads 3 are connected to the lower surface of the power supply plane 13, and the axes of the connection via lines 10 for power supply wiring align with the axes of the power supply electrode pads 3. The power supply electrode pads 3 and the opening portions 13a are arranged in matrix so as to be adjacent to each other on the surface of the power supply plane 13. Then, the connection via lines 11 for ground wiring are inserted into the opening portions 13a of the power supply plane 13, respectively. That is to say, the opening portions 13a are the clearances adapted to prevent the connection via lines 11 for ground wiring from coming into contact with the power supply plane 13.

Figure 5B:
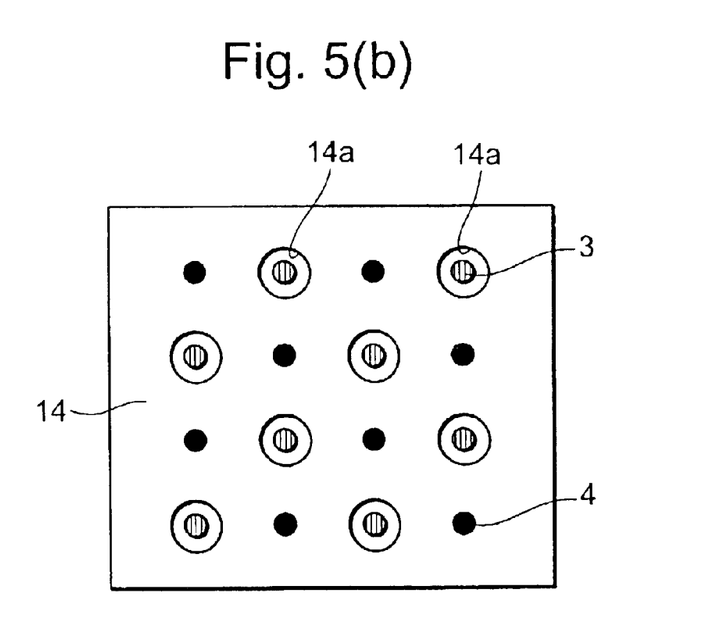

Likewise, the connection via lines 11 for ground wiring are connected to the upper surface of the ground plane 14, the ground electrode pads 4 are connected to the lower surface of the power supply plane 14, and the axes of the connection via lines 11 for ground wiring align with the axes of the ground electrode pads 4. The ground electrode pads 4 and the opening portions 14a are arranged in matrix so as to be adjacent to each other on the surface of the ground plane 14. Then, the power supply electrode pads 3 are inserted into the opening portions 14a of the ground plane 14, respectively. That is to say, the opening portions 14a are the clearances adapted to prevent the power supply electrode pads 3 from coming into contact with the ground plane 14.

By the way, in the present embodiment, the power supply plane 13 is provided on the upper side, i.e., on the side near the LSI package 2, while the ground plane 14 is provided on the lower side, i.e., in the position where the power supply plane 13 is sandwiched between the ground plane 14 and the LSI package 2. However, the positional relationship between the power supply plane 13 and the ground plane 14 may be reversed. In this case, the ground electrode pads 4 are inserted into the opening portions 13a of the power supply plane 13, respectively, and the connection via lines 10 for power supply wiring are inserted into the opening portions 14a of the ground plane 14, respectively.

In addition, assuming that relative permittivity of an insulator is $\epsilon_r$, permittivity of the vacuum is $\epsilon_0$, the width of an electrode (plane) is W, the length of the electrode (plane) is L and the distance between the electrodes (planes) is D, in general, the capacitance C of a plane parallel plate type capacitor is expressed by the following Expression 1. In the case of the decoupling capacitor 6 (refer to FIG. 2) of the present embodiment, a plurality of opening portions are formed through the upper side electrode and the lower side electrode, i.e., through the power supply plane 13 and the ground plane 14, and hence the effective area of the electrodes is smaller than that of the plane parallel plate type capacitor having no opening portion. For this reason, the capacitance of the decoupling capacitor 6 becomes smaller than that expressed by the following Expression 1.

$$C=(\epsilon_r \times \epsilon_0 \times W \times L)/D \qquad \text{Expression 1}$$

In addition, mounting the semiconductor integrated circuit 1 on a printed circuit board main body (not shown) allows a printed circuit board to be formed. Moreover, various kinds of electronic apparatuses can be loaded with this printed circuit board.

Next, the description will hereinbelow be given with respect to the operation of the semiconductor integrated circuit 1 according to the present embodiment. In the semiconductor integrated circuit 1, the power supply potential is supplied from the external power supply wiring to the LSI core chip 9 through the power supply electrode pads 3, the power supply plane 13, the connection via lines 10 for power supply wiring, the printed circuit board 7 and the solder bumps 8, and also the ground potential is supplied from the external ground wiring to the LSI core chip 9 through the ground electrode pads 4, the ground plane 14, the connection via lines 11 for ground wiring, the printed circuit board 7 and the solder bumps 8. In addition, a signal is inputted from an external circuit to the LSI core chip 9 through the signal electrode pads 5, the connection via lines 12 for signal wiring, the printed circuit board 7, and the solder bumps 8. Thus, the LSI core chip 9 is operated to carry out a predetermined arithmetic operation or the like to thereby output a signal through the solder bumps 8, the printed circuit board 7, the connection via lines 12 for signal wiring and the signal electrode pads 5. At this time, the decoupling capacitor 6 constituted by the power supply plane 13 and the ground plane 14 effectively absorbs the noise being propagated through the power supply wiring or the ground wiring to stabilize the operation of the LSI core chip 9. Also, the decoupling capacitor 6 suppresses the radiation of the radiation noise of the electromagnetic waves from the semiconductor integrated circuit 1.

In the present embodiment, the connection via lines 10 for power supply wiring and the connection via lines 11 for ground wiring are concentratedly arranged at the central portion of the rear surface 7b of the printed circuit board 7 to allow all the connection via lines 10 for power supply wiring and the connection via lines 11 for ground wiring to be connected to the decoupling capacitor 6. In addition, the connection via lines 10 for power supply wiring and the connection via lines 11 for ground wiring are arranged in matrix so as to be adjacent to each other, whereby the magnetic field generated by the connection via lines 10 for power supply wiring and the magnetic field generated by the connection via lines 11 for ground wiring cancel each other to allow the inductance to be reduced.

Furthermore, the opening portions 13a are formed through the power supply plane 13, the connection via lines 11 for ground wiring are inserted into the opening portions 13a, respectively, the opening portions 14a are formed through the ground plane 14, and the power supply electrode pads 3 are inserted into the opening portions 14a, respectively, whereby it is possible to shorten the wiring length between the printed circuit board 7 and the power supply electrode pads 3 and the wiring length between the printed circuit board 7 and the ground electrode pads 4. This results in that the inductance of these wiring lines can be further reduced. As a result, the decoupling capacitor 6 effectively absorb the noise being propagated through the power supply wiring or the ground wiring to allow the semiconductor integrated circuit 1 to be stably operated, and to allow a radiation quantity of the radiation noise of the electromagnetic waves radiated from the semiconductor integrated circuit 1 to be reduced. Thus, it is also possible to reduce a radiation quantity of the radiation noise of the electromagnetic waves radiated from a printed circuit board having the semiconductor integrated circuit 1 mounted thereon and an electronic apparatus loaded with the printed circuit board.

In addition, since in the semiconductor integrated circuit 1, the decoupling capacitor 6 is provided outside the LSI package 2, it is possible to adjust the characteristics of the decoupling capacitor 6 after completion of the manufacturing of the LSI package 2. As a result, after the LSI package 2 has been manufactured so as to meet the general specification, the characteristics of the decoupling capacitor 6 is adjusted in accordance with the application of use, whereby the semiconductor integrated circuit which is applicable to various applications can be manufactured at low cost. For example, the distance D (refer to FIG. 3) between the power supply plane 13 and the ground plane 14 is increased to allow the capacitance of the decoupling capacitor 6 to be decreased in accordance with the above-mentioned Expression 1. This results in the resonance frequency of the LC series resonance circuit constituted by the decoupling capacitor 6 and the inductance of the connection via lines 10 for power supply wiring, the power supply electrode pads 3, the connection via lines 11 for ground wiring and the ground electrode pads 4 being shifted to the higher frequency side. As a result, the frequency region in which any of their frequencies is lower than the resonance frequency and hence no resonance is caused is increased towards the higher frequency side so that it is possible to effectively suppress the noise being propagated through the power supply wiring or the ground wiring in the high frequency region.

Moreover, in the present embodiment, the decoupling capacitor 6 is provided outside the LSI package 2, whereby it is possible to shorten the length of the wiring from the decoupling capacitor 6 to the power supply electrode pads 3 and the ground electrode pads 4. This results in that it is possible to reduce the inductance of the wiring from the decoupling capacitor 6 to the power supply electrode pads 3 and the ground electrode pads 4 and hence it is possible to reduce the residual inductance accompanying the decoupling capacitor. As a result, the decoupling capacitor can effectively absorb the noise. By the way, the above-mentioned length of the wiring depends on the thickness of the decoupling capacitor, i.e., the distance between the power supply plane and the ground plane.

Figure 6A:
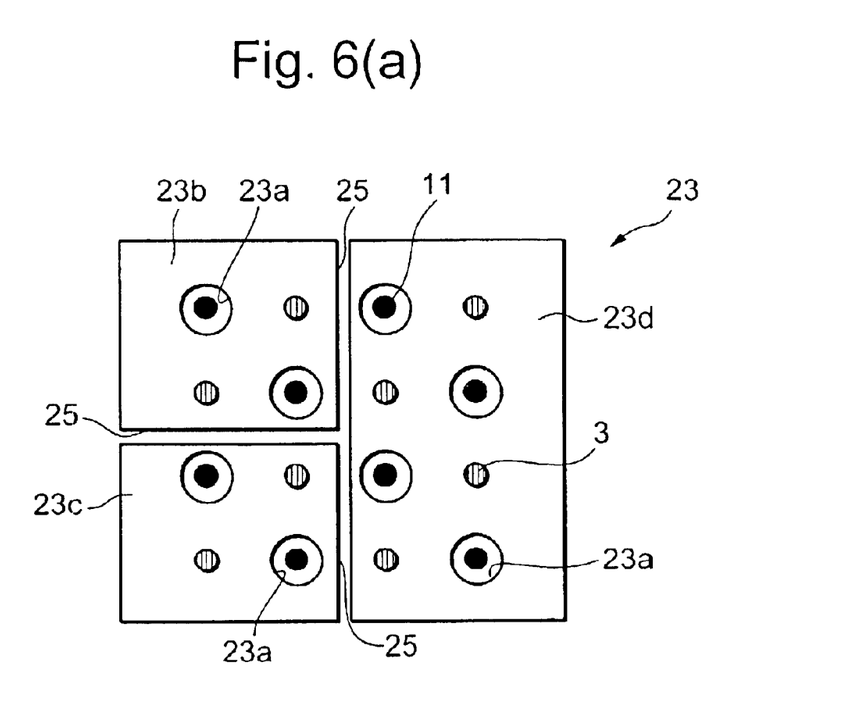
FIGS. 6(a) and (b) are plan views showing a power supply plane and a ground plane of the semiconductor integrated circuit according to a second embodiment of the present invention, respectively.
Figure 6B:
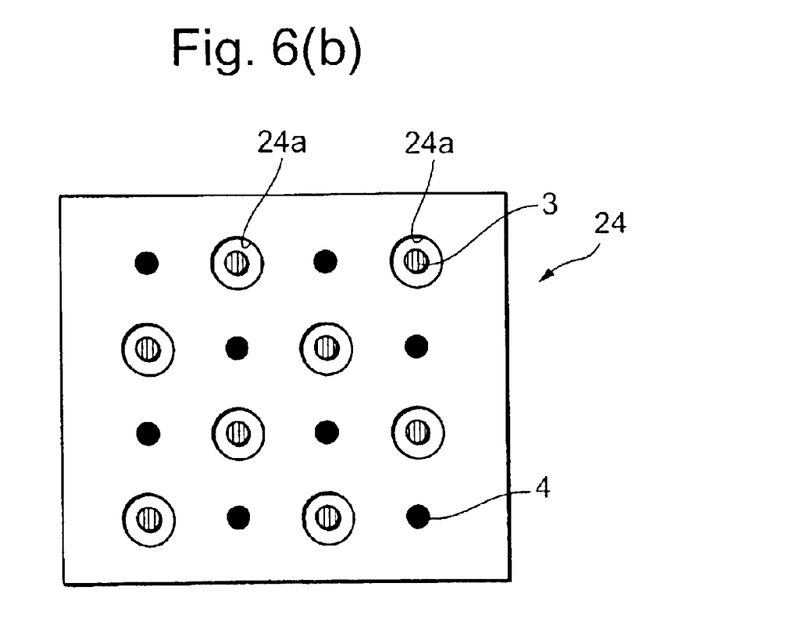

Next, a second embodiment of the present invention will hereinbelow be described. FIGS. 6(*a*) and (*b*) are plan views showing a power supply plane (a) and a ground plane (b) of a semiconductor integrated circuit according to the present embodiment, respectively, when viewed from the direction perpendicular to the bottom surface of the LSI package. In the semiconductor integrated circuit according to the present embodiment, a power supply plane 23 is provided on the upper side, i.e., on the side near the LSI package, while a ground plane 24 is provided on the lower side, i.e., in the position where the power supply plane 23 is sandwiched between the ground plane 24 and the LSI package. However, the positional relationship between the power supply plane 23 and the ground plane 24 may be reversed.

As shown in FIG. 6(*a*), the power supply plane 23 is divided into three parts 23b, 23c and 23d, and a slit 25 is defined between these parts. The parts 23b, 23c and 23d are insulated from one another. In addition, opening portions 23a are formed through the parts 23b, 23c and 23d, and the connection via lines 11 for ground wiring are inserted through the opening portions 23a, respectively. Moreover, the power supply electrode pads 3 are connected to the power supply plane 23. As shown in FIG. 6(*b*), the structure of the ground plane 24 is the same as that of the ground plane 14 (refer to FIG. 5(*b*)) in the above-mentioned first embodiment. The structure other than the foregoing in the present embodiment is the same as that other than the decoupling capacitor 6 in the semiconductor integrated circuit 1 according to the above-mentioned first embodiment.

Since the power supply plane 23 is divided into the three parts 23b, 23c and 23d in the present embodiment, three kinds of power supply voltages can be applied to the LSI core chip. For this reason, it is possible to use an electronic component in which three different kinds of power supply voltages are required for an LSI core chip. The effects other than the foregoing in the present embodiment are the same as those of the above-mentioned first embodiment.

By the way, while in the present embodiment, there has been shown the example in which the power supply plane 23 is divided into the three parts, the number of division of the power supply plane may also be two or four or more. In addition, there may be adopted such a constitution that a ground plane is divided into a plurality of parts, and a plurality of different kinds of reference voltages are applied to an LSI core chip.

Figure 7:
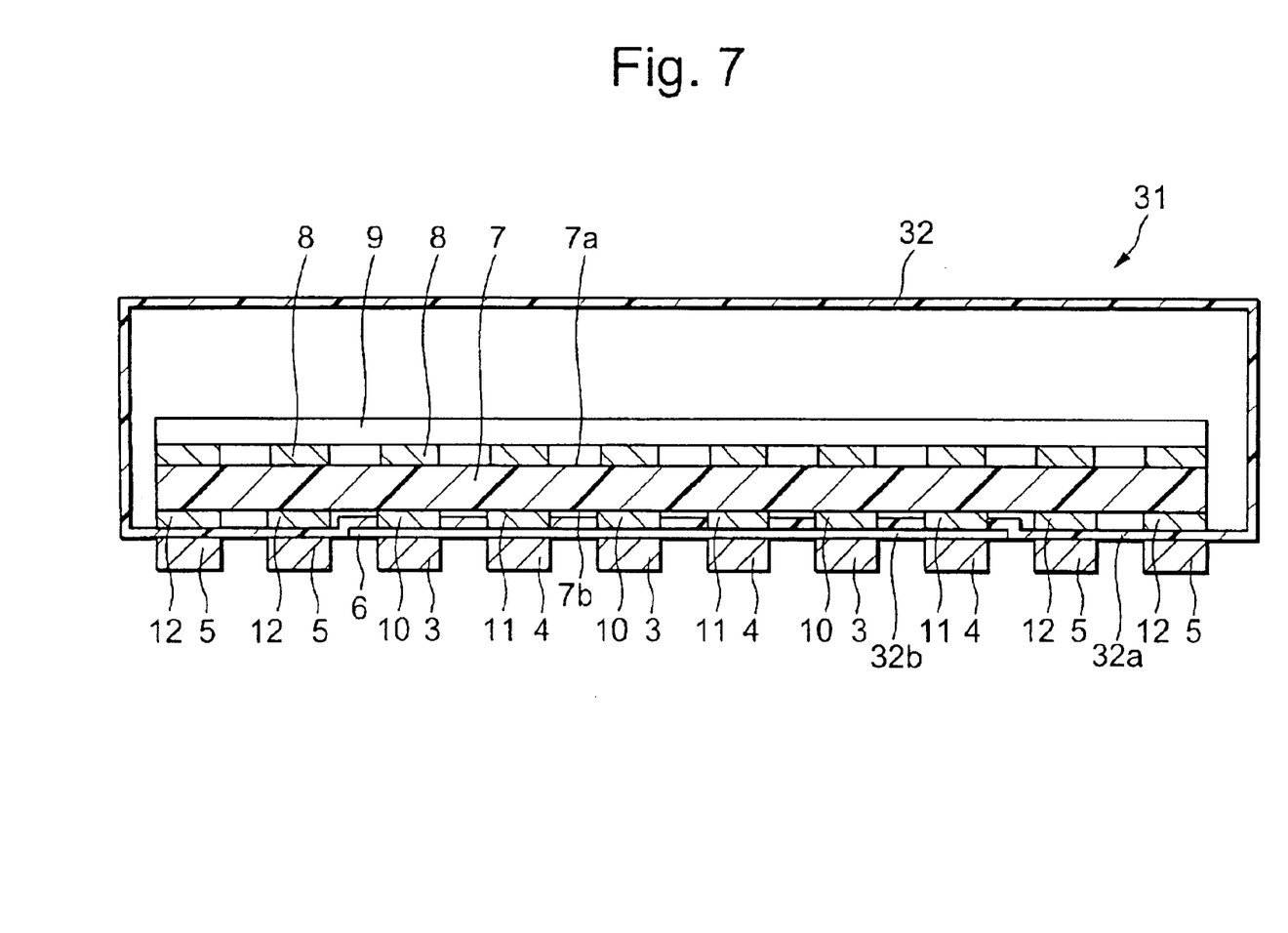
FIG. 7 is a cross sectional view showing a semiconductor integrated circuit according to a third embodiment of the present invention.

Next, a third embodiment of the present invention will hereinbelow be described. FIG. 7 is a cross sectional view showing a semiconductor integrated circuit according to the third embodiment of the present invention. In FIG. 7, the same constituent elements as those of the semiconductor integrated circuit according to the above-mentioned first embodiment (refer to FIG. 1) are designated with the same reference numerals, and the detailed description thereof is omitted here. As shown in FIG. 7, in a semiconductor integrated circuit 31 according to the present embodiment, an LSI package 32 is provided, and a concave portion 32b is formed at the central portion of a bottom surface 32a of the LSI package 32. Then, the decoupling capacitor 6 is accommodated in the concave portion 32b. As a result, the outer surface of the decoupling capacitor 6 constitutes a part of the outer surface of the LSI package 32. That is to say, the decoupling capacitor 6 is exposed to the outside in the outer surface of the LSI package 32. The structure other than the foregoing in the present embodiment is the same as that of the above-mentioned first embodiment.

In the present embodiment, since the decoupling capacitor 6 is arranged in the concave portion 32b of the LSI package 32, the distance between the printed circuit board 7 and the decoupling capacitor 6 becomes shorter and hence the inductance of the wiring distributed therebetween is further reduced as compared with the above-mentioned first embodiment. As a result, it is possible to further reduce the radiation noise of the electromagnetic waves from the semiconductor integrated circuit 31, a printed circuit board loaded with the semiconductor integrated circuit 31 and an electronic apparatus loaded with the printed circuit board. In addition, since the wiring distributed between the semiconductor integrated circuit 31 and components arranged in the periphery of the semiconductor integrated circuit 31 can be carried out highly densely and readily, it is possible to promote the higher density of the printed circuit board and also it is possible to realize the miniaturization and the light weight of an electronic apparatus.

Moreover, since the decoupling capacitor 6 is exposed to the outside in the external surface of the LSI package 32, after completion of the manufacturing of the LSI package 32, the characteristics of the decoupling capacitor 6 can be adjusted in accordance with the application, the usage. The effects other than the foregoing in the present embodiment are the same as those in the above-mentioned first embodiment.

By the way, in the above-mentioned embodiments, the number of power supply electrode pads 3 of the semiconductor integrated circuit, the number of ground electrode pads 4 thereof and the number of signal electrode pads 5 thereof are not intended to be limited to those shown in FIGS. 1 to 7. In addition, positions of the ground electrode pads and the power supply electrode pads are allowed to be counterchanged from the positions shown in the drawing, and thus they can be changed in accordance with the application. Moreover, the ground electrode pads and the power supply electrode pads may be arranged in a peripheral state or in a spiral state so as to be adjacent to each other.

What is claimed is:

1. A semiconductor integrated circuit comprising:
   a semiconductor package having a printed circuit board, a semiconductor chip mounted on a first surface of said printed circuit board, at least one power supply electrode on a second surface of said printed circuit board and connected to at least one power supply terminal of said semiconductor chip, and at least one ground electrode on said second surface of said printed circuit board and connected to at least one ground terminal of said semiconductor chip;
   a decoupling capacitor disposed outside said semiconductor package and formed by a power supply plane connected to said at least one power supply electrode, and a ground plane connected to said at least one ground electrodes;
   at least one power supply electrode pad connected to said power supply plane; and
   at least one ground electrode pad connected to said ground plane,
   wherein at least one of said power supply plane and said ground plane is divided into a plurality of parts which are insulated from one another.

2. A semiconductor integrated circuit according to claim 1, wherein said power supply plane and said ground plane are substantially parallel with a bottom surface of said semiconductor package.

3. A semiconductor integrated circuit according to claim 2, wherein said power supply plane has at least one opening portion which at least one of said ground electrode and said ground electrode pad goes through, and said ground plane has at least one opening portion which at least one of said power supply electrode and said power supply electrode pads goes through.

4. A semiconductor integrated circuit according to claim 3, wherein said power supply electrode and said ground electrode are arranged on a central portion of said printed circuit board.

5. A semiconductor integrated circuit according to claim 4, wherein said power supply electrode and said ground electrode are arranged in a matrix so as to be adjacent to each other.

6. A semiconductor integrated circuit according to claim 5, wherein at least one signal electrode is provided in a peripheral portion of the second surface of said printed circuit board and connected to one signal terminal of said semiconductor chip, and at least one signal electrode pad connected to said signal electrode.

7. A semiconductor integrated circuit according to claim 1, wherein said power supply electrode and said ground electrode are arranged on a central portion of said printed circuit board.

8. A semiconductor integrated circuit according to claim 7, wherein said power supply electrode and said ground electrode are arranged in a matrix so as to be adjacent to each other.

9. A semiconductor integrated circuit according to claim 8, wherein at least one signal electrode is provided in a peripheral portion of the second surface of said printed circuit board and connected to one signal terminal of said semiconductor chip, and at least one signal electrode pad connected to said signal electrode.

10. A semiconductor integrated circuit according to claim 1
    wherein a concave portion is provided on a central portion of an outer surface of said semiconductor package and said decoupling capacitor is disposed in said concave portion.

11. A semiconductor integrated circuit according to claim 10, wherein said power supply electrode and said ground electrode are arranged on a central portion of said printed circuit board.

12. A semiconductor integrated circuit according to claim 11, wherein said power supply electrode and said ground electrode are arranged in a matrix so as to be adjacent to each other.

13. A semiconductor integrated circuit according to claim 12, wherein at least one signal electrode is provided in a peripheral portion of the second surface of said printed circuit board and connected to one signal terminal of said semiconductor chip, and at least signal electrode pads connected to said signal electrode.

14. A printed circuit board forming a part of a semiconductor integrated circuit comprising:

a semiconductor package having a printed circuit board, a semiconductor chip mounted on a first surface of said printed circuit board, at least one power supply electrode on said second surface of said printed circuit board and connected to at least one power supply terminal of said semiconductor chip, and at least one ground electrode on a second surface of said printed circuit board and connected to at least one ground terminal of said semiconductor chip;

a decoupling capacitor disposed outside said semiconductor package and formed by a power supply plane connected to said power supply electrodes, and a ground plane connected to said ground electrodes;

at least one power supply electrode pad connected to said power supply plane; and at least one ground electrode pad connected to said ground plane, wherein at least one of said power supply plane and said ground plane is divided into a plurality of parts which are insulated from one another.

15. An electronic apparatus including a semiconductor integrated circuit:

wherein said semiconductor integrated circuit comprises a semiconductor package having a printed circuit board, a semiconductor chip mounted on a first surface of said printed circuit board, at least one power supply electrode on a second surface of said printed circuit board and connected to at least one power supply terminal of said semiconductor chip, and at least one ground electrode on said second surface of said printed circuit board and connected to at least one ground terminal of said semiconductor chip;

a decoupling capacitor disposed outside said semiconductor package and formed by a power supply plane connected to said at least one power supply electrode, and a ground plane connected to said at least one ground electrode;

at least one power supply electrode pad connected to said power supply plane; and at least one ground electrode pad connected to said ground plane, wherein at least one of said power supply plane and said ground plane is divided into a plurality of parts which are insulated from one another.

16. A semiconductor integrated circuit comprising:

a semiconductor package having a printed circuit board, a semiconductor chip mounted on a first surface of said printed circuit board, at least one power supply electrode on a second surface of said printed circuit board and connected to at least one power supply terminal of said semiconductor chip, and at least one ground electrode on said second surface of said printed circuit board and connected to at least one ground terminal of said semiconductor chip;

a decoupling capacitor formed as part of an external surface of said semiconductor package and formed by a power supply plane connected to said at least one power supply electrode, and a groundplane connected to said at least one ground electrode;

at least one power supply electrode pad connected to said power supply plane; and at least one ground electrode pad connected to said ground plane, wherein at least one of said power supply plane and said ground plane is divided into a plurality of parts which are insulated from one another.

* * * * *